(12) United States Patent
Oldrey

(10) Patent No.: US 7,269,029 B2
(45) Date of Patent: Sep. 11, 2007

(54) RAPID FIRE TEST BOARD

(75) Inventor: Richard W. Oldrey, Clintondale, NY (US)

(73) Assignee: International Business Machines Corporation, Armonk, NY (US)

( * ) Notice: Subject to any disclaimer, the term of this patent is extended or adjusted under 35 U.S.C. 154(b) by 367 days.

(21) Appl. No.: 10/904,416

(22) Filed: Nov. 9, 2004

(65) Prior Publication Data
US 2006/0097736 A1    May 11, 2006

(51) Int. Cl.
H05K 1/14    (2006.01)

(52) U.S. Cl. .............. 361/794; 361/792; 361/793; 361/795; 361/796; 361/797; 174/255; 174/261; 174/262; 174/266; 324/754; 324/756

(58) Field of Classification Search ......... 361/792–795
See application file for complete search history.

(56) References Cited

U.S. PATENT DOCUMENTS

| 4,799,128 | A | * | 1/1989 | Chen | 361/795 |
|---|---|---|---|---|---|
| 5,101,149 | A | * | 3/1992 | Adams et al. | 324/73.1 |
| 5,469,064 | A | | 11/1995 | Kerschner et al. | |
| 5,502,397 | A | | 3/1996 | Buchanan | |
| 5,870,290 | A | | 2/1999 | Chun et al. | |
| 5,906,042 | A | * | 5/1999 | Lan et al. | 29/852 |
| 6,043,669 | A | | 3/2000 | Carroll | |
| 6,094,056 | A | | 7/2000 | Bardsley et al. | |
| 6,208,155 | B1 | | 3/2001 | Barabi et al. | |
| 6,249,045 | B1 | * | 6/2001 | Kresge et al. | 257/678 |
| 6,292,004 | B1 | | 9/2001 | Kocher | |
| 6,359,452 | B1 | | 3/2002 | Mozzetta | |
| 6,391,669 | B1 | * | 5/2002 | Fasano et al. | 438/18 |
| 6,512,389 | B1 | | 1/2003 | Kocher | |
| 6,611,419 | B1 | * | 8/2003 | Chakravorty | 361/306.3 |
| 6,774,640 | B2 | * | 8/2004 | Li | 324/557 |
| 2002/0108778 | A1 | * | 8/2002 | Dishongh et al. | 174/261 |
| 2003/0133279 | A1 | * | 7/2003 | Shirasaki | 361/795 |
| 2004/0119487 | A1 | * | 6/2004 | Song et al. | 324/758 |

FOREIGN PATENT DOCUMENTS

JP    6160473    6/1994

* cited by examiner

Primary Examiner—Tuan T. Dinh
Assistant Examiner—Hoa C Nguyen
(74) Attorney, Agent, or Firm—Yuanmin Cai; Lisa U. Jaklitsch; Hoffman, Warnick, D'Alessandro

(57) ABSTRACT

A test board for testing a packaged integrated circuit has a set of contacts matching counterpart contacts on a socket. The contacts are each connected to a first voltage plane containing power, a second voltage plane carrying ground, and a set of terminals that will be connected to a tester system. The number of terminals necessary to operate the circuit is identified, both power terminal and signal-carrying terminals to the affected part of the circuit, and two of the three connections to the contacts are severed; e.g. the terminal carrying signals is disconnected from the power and ground. The disconnect from the voltage planes may be performed by an automated milling machine in a short time, providing much faster turnaround than a method that forms a custom-made board.

13 Claims, 3 Drawing Sheets

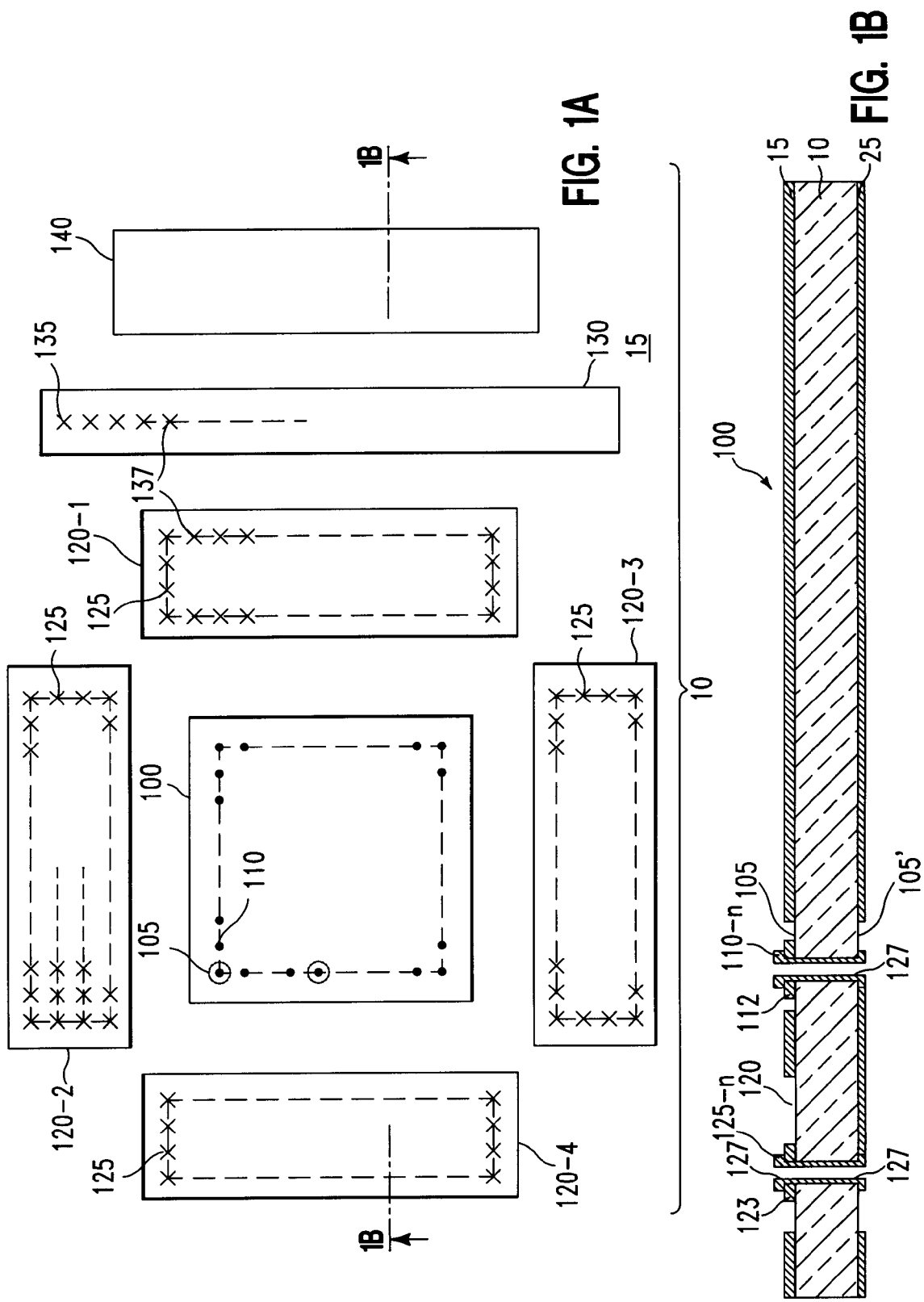

RAPID FIRE TEST BOARD

TECHNICAL FIELD

The field of the invention is that of manufacturing Integrated Circuits, in particular the field of performing electrical testing of packaged devices.

BACKGROUND OF THE INVENTION

The testing process for integrated circuits requires a means of connecting the electrical leads of the packaged device to the equipment performing the test, so that a test vector of data may be fed into the device and that the result of processing the test vector may be compared with the correct result in order to identify the particular sub-circuit that is not working correctly.

This connection process is most often accomplished using a socket designed to hold the packaged device mounted on a printed circuit board. This board is either directly connected to the tester or is connected through a set of electrical cables. This board is also most often fabricated from multiple levels of metal wiring (usually copper) separated by insulating material. The most common insulating material, among others, is referred to as FR-4.

The basic building block of a multilayer board is a very thin sheet of insulating material plated with copper on one or both sides. Wiring is created by patterning the copper and etching away copper from the areas where there is to be no wiring. This is done on several thin sheets and that are then stacked up with insulating material placed in between. Holes are drilled and connections from level to level are created by plating through the holes.

Despite the fact that many different devices may be placed in the same size and type of package, differing functions of devices require that a specific board be fabricated for each device or chip. An example would be a CPU chip and an ASIC chip, which have very different functions and wiring, each being packaged in a 41×41 land grid array (LGA). Physically each would fit in the same socket, but the connections back to the tester would be completely different. Hence the requirement for a different test board.

When performing failure analysis of defective chips it is often possible to run the device using a reduced number of signals. Regardless of the number of test signals needed, the design and fabrication time for a test board is still the same as for a fully connected board.

The design phase is usually a two to three week process. The fabrication is also a two to three week process. So, in spite of the fact that you may already have a test board with a socket for a 41×41 LGA, the wiring differences cause you to do a redesign and new fabrication. The total time spent is somewhere between six and eight weeks when you add the time spent verifying the design before committing it to hardware, shipping time and inspection of the boards after fabrication.

In current marketing conditions, reduction of the time getting a solution to market can be extremely valuable.

SUMMARY OF THE INVENTION

The invention relates to a test board for connecting an integrated circuit under test to a testing system in which all contacts matching pins on the integrated circuit package are connected by conductive paths to three different sources; voltage supply, ground and a pin or contact that may be connected to a testing system.

A feature of the invention is that at least two of the three conductive paths are opened, such that each socket contact is connected to only one source.

A feature of the invention is that conductive paths to the voltage supply and to the ground are cut by an automated milling machine or equivalent tool.

BRIEF DESCRIPTION OF THE DRAWINGS

FIG. 1A shows a top view of a test board according to the invention.

FIG. 1B shows a cross section of the board of FIG. 1A.

DETAILED DESCRIPTION

Figure 3:
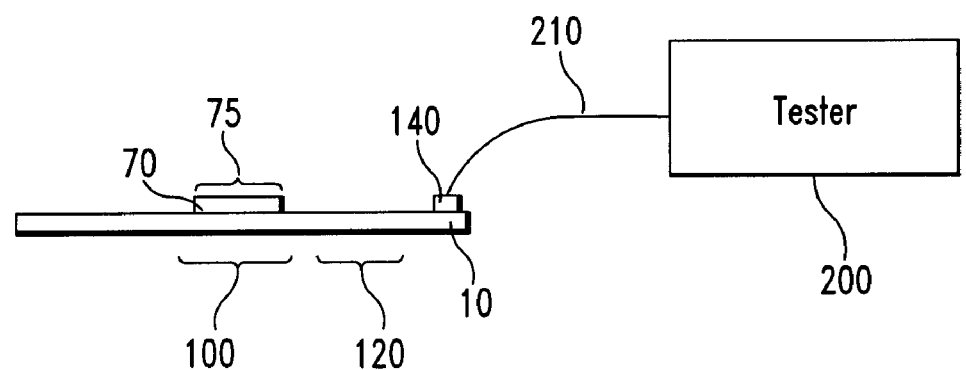
FIG. 3 shows in simplified form an overall view of a system according to the invention.

A test system according to the invention, illustrated in simplified form in FIG. 3, will have a testing system 200 for connecting supply voltage and ground to a circuit under test (75) and a test board (10) having a socket (70) adapted to fit the circuit under test and connections (140) adapted to fit with the tester system.

FIG. 1A shows a top view of a board 10 according to the invention, in which top surface 15 of the board is a copper film that is connected to the power supply voltage.

At the center of the board, contact array 100 has an array of contacts 110 that are the top of through-holes that extend down through the board to make contact with other portions of the system. This figure shows the board before the optional attachment to array 100 of a socket adapted to fit the pins of the integrated circuit package.

Before customizing, the copper 15 extends throughout the area of array 100 and makes contact with each through-hole in the array. Similarly, a corresponding copper sheet 25 extends on the bottom surface of the board, connected to ground. As described above, each contact in the LGA is thus connected to the power supply, to ground and, as described below, to a terminal that may carry a signal.

Selected contacts in array 100 have a circle 105 that represents an area where the copper 15 has been removed, e.g. by a computer-controlled milling machine, to isolate that contact from voltage plane 15. Within circles 105 there is a pad of copper 112 that provides a convenient contact area.

On the four sides of contact array 100, terminal arrays 120-1 to 120-4 have their areas stripped of the copper 15, by machining, etching or any other convenient method. The top of the contact structure is denoted in FIG. 1A by "x"es 125.

FIG. 1B shows a cross section through line 1B-1B of FIG. 1A that illustrates an interior connection according to the invention. For convenience in exposition, the cross section does not show a multi-layer board, but only a single layer. The board has copper top surface 15, on interior insulator 10 and a copper lower surface 25. On the top surface, copper 15 is removed in circles 105 and in area 120-i. Within areas 120-i, a set of x's denote through-holes 125 similar to through-holes 110 described above. The illustrated stripping process leaves copper pads 123 that can be seen in the cross section of FIG. 1B. In this example, the plating process applied to the through-holes has formed a conductive film 127 (illustratively solder) along the vertical height and a small amount 110-$n$ and 125-$n$ of surplus material. Those skilled in the art will be aware that many structures are possible, and the particular version shown is illustrative.

At the top of FIG. (1B), box 70 represents schematically a socket that fits the IC package being tested and the IC itself. Socket 70 will be bonded to the contacts in array 100 by any convenient method such as reflow soldering after film 15 has been patterned.

Continuing with FIG. (1B), contact 110-$n$ to the right is in the contact array 100. On the left, contact 127 is in terminal array 120, isolated by the insulator of board 10. Thus, the two contacts 110-$n$ and 125-$n$ have been isolated from ground and the voltage plane 15.

A conductive path is formed between the two contacts 110-$n$ and 125-$n$ by plating solder 127 or other conductor on the interior of the through-holes, so that there is a first vertical conductive path from contact 110-$n$ down the through-hole and a second vertical conductive path from contact 125-$n$ down the through-hole. On the lower surface of board 10, a horizontal conductive path 117 extends through copper 25 connecting the plated material 127 in through-hole 125-$n$ with corresponding material 127 in through-hole 110-$n$. This transverse conductive path will be extended to the tester and will carry signals between the tester and the circuit.

According to the use of the invention, a supply of stock boards are fabricated in such a way that all connections in the contact array 100 are wired to Power and Ground, and are jumperable to tester channels through a transverse connection 117 on an intermediate layer. The two connections for any particular pin that are not needed will be disconnected. When the connections in question are to be connected to one of power and ground, the connection to sheet 15 (or 25) is maintained and the other connection is severed by cutting away the conductor. The connection to the tester for that pin is disconnected by not connecting a cable.

The process of disconnecting on sheets 15 and 25 can be automated so that the board can be customized in a matter of hours instead of weeks. Using this method, a series of stock boards could be fabricated to cover the most commonly used package types. When a test board is needed for a chip that is packaged in one of the types for which a generic board has been fabricated, a list of power, ground and signal pins would be used to program a computer controlled milling machine to make the cuts.

Once the cuts are made, jumper wires are installed for the necessary signals from terminals 125 to the tester, and the board is permanently assigned to that particular chip and package combination. On the right side of FIG. 1A, there is shown schematically, rectangle 130, (referred to as a tester contact array) containing contacts 135 that receive the jumper wires for tester signals. Illustratively, the copper sheet 15 is stripped in the rectangle 130 and the conductive path to the tester system plug (rectangle 140) is along an intermediate conductive sheet.

In the case of a pin on the test chip that is to be connected to the tester system, the relevant contacts 110 are severed from the power plane and the ground plane. The remaining contact through the interior of board 10 to the relevant contact 125 in area 120-2, say, is maintained. A jumper cable 137 is connected from contact 125 to a contact 135 in tester array 130.

In this particular example, an internal conductive path has been formed from contact 135 to a contact in a standard plug represented schematically by box 140. In operation, the plug of the tester is in place in box 140 and the signal passes along the path from the test chip in array 100 through the internal path to contact 125, along the jumper cable to contact 135 and into the plug.

In the case of a tester that does not have a plug but rather a set of flexible cables, the tester may be connected to the relevant contacts 125-$i$.

Surrounding the test socket are four terminal arrays of plated through holes 120-1 through 120-4. Each array is one quarter of the total number of pins in the test socket. For this example that would be 420 in each, plus one extra. These holes would be internally wired to the contact positions in the test socket array. These holes would also be connected to power plane 15 on the top surface of the board and ground plane 25 on the bottom surface. Every position in the test socket would be connected to power, ground and a location for a jumper wire before the board is customized for a particular device.

Located adjacent to the tester connections at the right side of the board is another array of holes 135 that are connected internally through wiring layers to the tester connections represented by plug 140. This array 135 is where the other end of the jumper wires from the arrays adjacent to the test socket are connected.

The method of fabricating a board 10 suitable for use with the invention comprises;

1) assemble a set of printed circuit boards with conductive sheet(s) bonded to at least one side;

2) lay out a pattern on the top sheet for a contact array (100), terminal arrays (120) and optionally a tester array (135) and plug (140);

3) pattern the top sheet;

4) pattern intermediate layers to connect each member of the contact array to a corresponding member of a terminal array;

5) assemble sets of boards, drill through-holes; and 6) plate the through-holes.

For a failing device type for which a generic board with the proper test socket is available the following actions would occur.

1) The number and location, in the test socket, of the minimum number of signals necessary for the device to function is determined. For many failures this is between 10 and 50 signals. As many signals as there are tester channels can be wired. Let's assume 20 signals for this example.

Let's also assume that they are evenly distributed within the test socket and 5 go to each of the four arrays surrounding the test socket. Using the wiring list for the generic board that shows where these 20 signals are located out in the adjacent arrays, isolation cuts 105 and 105' are made in the top surface and bottom surface of the board to disconnect the plated through holes from power and ground. The plated through hole is then jumper wired to an available tester channel in the array adjacent to the tester connections.

2) The pins necessary for power would be identified and the ground connections on the bottom of the board would be cut.

3) The pins necessary for ground would be identified and the power connections on the top surface of the board would be cut.

4) The remaining plated through holes 110 are then disconnected from the power plane or the ground plane to prevent shorts. Input pins that are unused but should be tied to ground could be left connected to the ground plane, and isolated later if necessary.

5) A socket is then bonded to contact array 100 to receive an integrated circuit being tested.

The result at this point is a custom board wired for the minimum number of connections necessary to make the device function. The jumpers can be made pluggable so that changes in signal wiring can be done. If another device shares the same power and ground connections, additional signal channels could be connected to make it work with the new device.

Figure 2B:
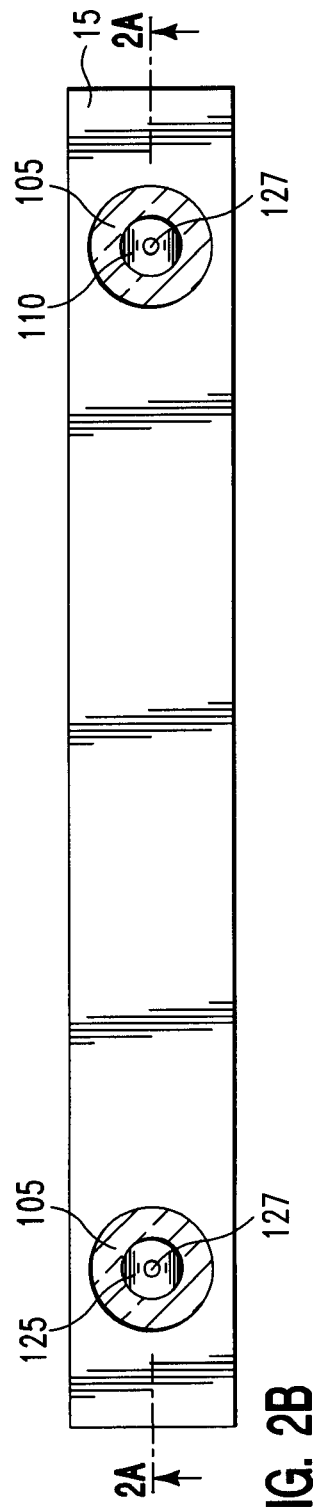
FIG. 2B shows a top view of the board of FIG. 2A.
Figure 2A:
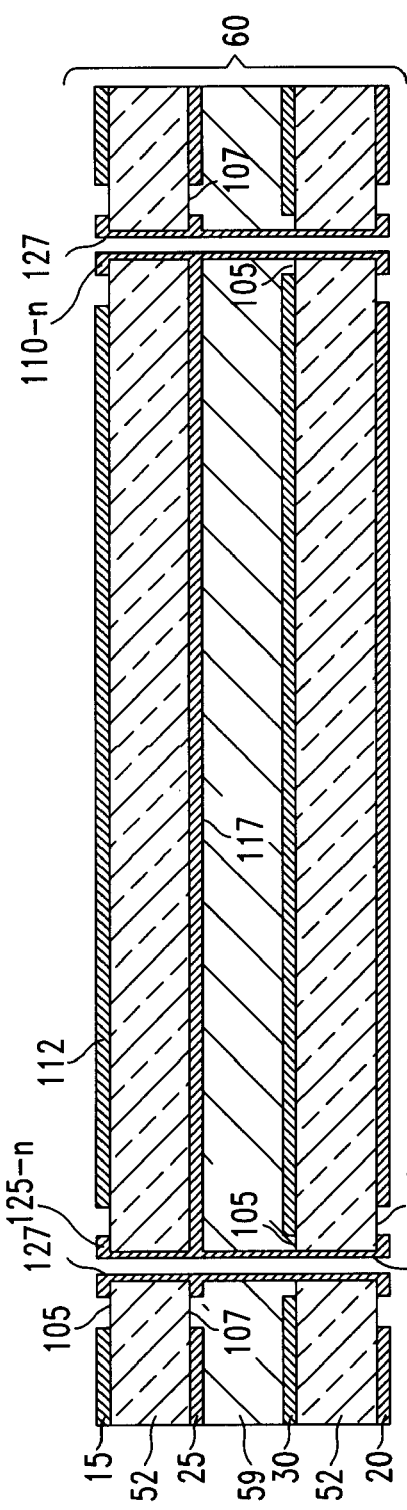
FIG. 2A shows a cross section of a board according to the invention.

FIG. 2A shows a cross section of a four-layer board denoted by numeral 60 having conductive sheet 15 for the power distribution, internal connecting conductive sheet 25, second internal conductive sheet 30 and ground conductive sheet 20. More conducive layers may be added if required.

An upper and lower insulator 52 are illustratively the same material (FR-4) and an intermediate insulator 54 (illustratively Pre-Preg) may be any convenient material. The conductive sheets may be attached to any surface that is convenient, e.g. sheets 15 and 25 on top insulator 52 and sheets 30 and 20 on lower insulator 52. Alternatively, insulator 54 and lower insulator 52 might each have one conductive sheet on the lower surface, etc.

Figure 2C:
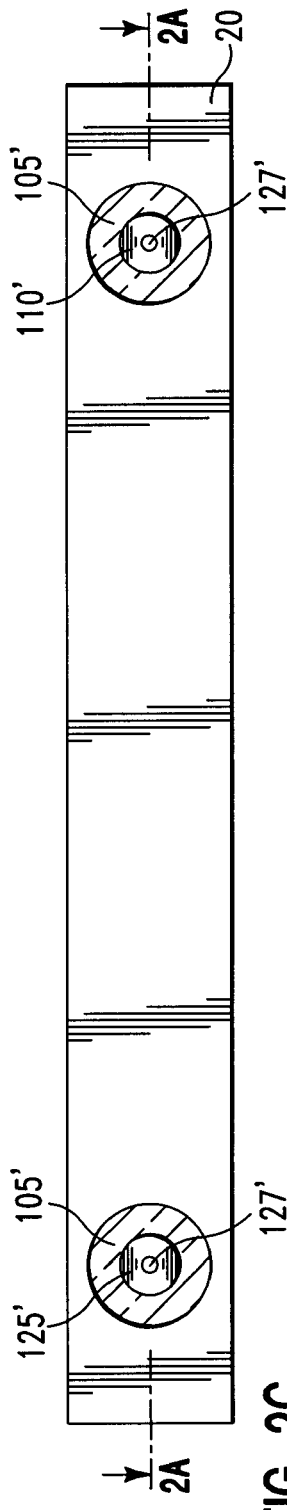
FIG. 2C shows a bottom view of the board of FIG. 2A.

FIGS. 2B and 2C show top and bottom views respectively.

In this example, as in the example discussed with respect to FIG. 1, a contact 110 is to be connected to a contact 125. FIG. 2B shows a circle 105 milled/etched out of the copper 15, isolating contact 110 and contact 125.

Similarly, FIG. 2C shows the same structure, with a circle 105' milled/etched out of the copper 20, isolating contact 110' and contact 125'.

Referring back to FIG. 2A, sheet 30 has had two insulating circles 105 milled/etched to isolate the vertical conductive structure from sheet 30. Illustratively, sheet 30 is used for other internal connections that would intersect a connection in sheet 25.

Sheet 25 has had an insulating path 107 milled to establish a conductive path 117 between the two conductive vertical columns 127.

Figure 2D:
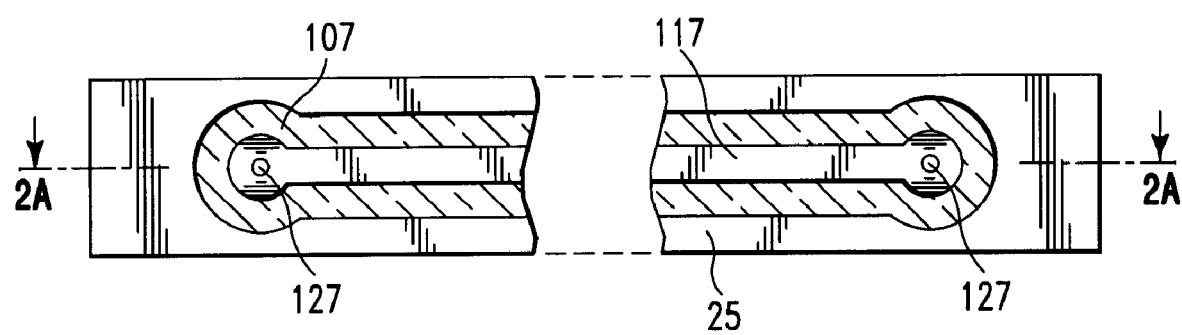
FIG. 2D shows a plan view of an intermediate layer of the board of FIG. 2A.

FIG. 2D shows a top view of sheet 25, with an insulating path 107 milled out of copper 25, thereby establishing a conductive path 117 through copper 25 between conductive material 127 in each through-hole.

Those skilled in the art will appreciate that the use of a socket 70 is optional, depending on the type of package that holds the circuit being tested. In the case of a package having pins that fit into a socket, the structure represented by box 70 in FIG. 1B will be a compatible socket. In the case of a socket having "flip-chip" solder connections, the structure 70 may represent the integrated circuit itself, which may be soldered to the test board or may be attached temporarily by conductive glue or any convenient removable method.

While the invention has been described in terms of a single preferred embodiment, those skilled in the art will recognize that the invention can be practiced in various versions within the spirit and scope of the following claims.

What is claimed is:

1. A test board for holding an integrated circuit comprising:
    a substrate comprising at least one layer having a first conductive voltage plane on a first surface thereof, a second conductive voltage plane on a second surface thereof opposite said first surface and at least one intermediate conductive layer isolated from said first voltage plane and from said second voltage plane;
    at least one contact array comprising a set of contacts adapted to make electrical contact with said integrated circuit, formed on said first voltage plane and making electrical contact with said first voltage plane;
    at least one terminal array having a set of electrical terminals disposed on at least one of said first surface and said second surface and making electrical contact with a transverse conductive element formed from said intermediate conductive layer;
    a first set of vertical conductive structures extending from a member of said contact array to a corresponding member of a corresponding contact array in said second conductive voltage plane and also making electrical contact with said transverse conductive element formed from said intermediate conductive layer that makes electrical contact with at least one member of said terminal array; and wherein a first subset of said set of contacts in said contact array are connected to said first voltage plane and isolated from said second voltage plane at the time of fabrication of the test board, a second subset of said set of contacts in said contact array are connected to said second voltage plane and isolated from said first voltage plane at the time of fabrication of the test board and a third subset of said set of contacts in said contact array that are connected to corresponding members of said terminal array and isolated from said first voltage plane and from said second voltage plane at the time of fabrication of the test board.

2. A test board according to claim 1, further comprising a tester connection and a test contact array of terminals connected to said tester connection, said test contact array of terminals being adapted to be connected by a temporary connection to corresponding members of said terminal array.

3. A test board according to claim 2, in which said set of electrical terminals in said terminal array are adapted to connect to a temporary wire.

4. A test board according to claim 1, having at least two intermediate conductive layers.

5. A test board according to claim 1, having a connector for a testing system.

6. A test board according to claim 1, in which said set of electrical terminals in said terminal array are adapted to connect to a temporary wire.

7. A method for fabricating a test board for holding an integrated circuit comprising;
    providing a substrate comprising at least one layer having a first conductive voltage plane on a first surface thereof, a second conductive voltage plane on a second surface thereof opposite said first surface and at least one intermediate conductive layer isolated from said first voltage plane and from said second voltage plane;
    at least one contact array comprising a set of contacts adapted to make electrical contact with said integrated circuit, formed on said first voltage plane and making electrical contact with said first voltage plane;
    at least one terminal array having a set of electrical terminals disposed on at least one of said first surface and said second surface and making electrical contact with a transverse conductive element formed from said intermediate conductive layer;
    a first set of vertical conductive structures extending from a member of said contact array to a corresponding member of a corresponding contact array in said second conductive voltage plane and also making electrical contact with said transverse conductive element formed from said intermediate conductive layer that makes electrical contact with at least one member of said terminal array;
    connecting a first subset of said set of contacts in said contact array to said first voltage plane and isolating said first subset of said set of contacts in said contact array from said second voltage plane;

connecting a second subset of said set of contacts in said contact array to said second voltage plane and isolating said second subset of said set of contacts in said contact array from said first voltage plane; and connecting a third subset of said set of contacts in said contact array to corresponding members of said terminal array and isolating said third subset of contacts from said first voltage plane and from said second voltage plane, whereby said third subset of contacts are adapted to carry signals between a tester and an integrated circuit under test.

8. A method according to claim 7, further comprising the steps of:

Bonding a socket to said contact array after said step of isolating said second subset of said set of contacts from said first voltage plane and isolating said second subset of said set of contacts from said first voltage plane, said socket being adapted to receive an integrated circuit under test.

9. A method according to claim 7, further comprising providing a tester connection and a test contact array of terminals connected to said tester connection, said test contact array of terminals being adapted to be connected by a temporary connection to corresponding members of said terminal array.

10. A method according to claim 7, comprising providing at least two intermediate conductive layers.

11. A method according to claim 7, comprising providing a connector for a testing system.

12. A method according to claim 7, in which said set of electrical terminals in said terminal array are adapted to connect to a temporary wire.

13. A method according to claim 7, further comprising a step of connecting said third subset of said set of contacts in said terminal array to said tester contacts.

* * * * *